(12) United States Patent
Choi (10) Patent No.: US 9,443,609 B2
(45) Date of Patent: Sep. 13, 2016

(54) VOLTAGE MONITORING TEST CIRCUIT AND VOLTAGE MONITORING METHOD USING THE SAME

(75) Inventor: Young Geun Choi, Icheon-si (KR)

(73) Assignee: SK HYNIX INC., Icheon-si, Gyeonggi-do (KR)

( * ) Notice: Subject to any disclaimer, the term of this patent is extended or adjusted under 35 U.S.C. 154(b) by 1020 days.

(21) Appl. No.: 13/339,173

(22) Filed: Dec. 28, 2011

(65) Prior Publication Data

US 2013/0049736 A1 Feb. 28, 2013

(30) Foreign Application Priority Data

Aug. 25, 2011 (KR) .......................... 10-2011-0084889

(51) Int. Cl.
*G11C 29/02* (2006.01)
*G11C 29/12* (2006.01)
*G11C 29/48* (2006.01)
*H02M 3/156* (2006.01)

(52) U.S. Cl.
CPC ......... *G11C 29/021* (2013.01); *G11C 29/1201* (2013.01); *G11C 29/48* (2013.01); *H02M 3/156* (2013.01)

(58) Field of Classification Search
CPC ...... G11C 5/147; G11C 29/021; G11C 29/48
USPC .......................... 324/126–128, 140 R–140 D, 324/76.11–76.38
See application file for complete search history.

(56) References Cited

U.S. PATENT DOCUMENTS

| | | | | |
|---|---|---|---|---|
| 4,520,416 A | * | 5/1985 | Karash | .............................. 361/11 |
| 5,493,234 A | * | 2/1996 | Oh | .................... 326/33 |
| 7,173,480 B2 | * | 2/2007 | Kim | ....................... G11C 5/147 327/538 |
| 2002/0093846 A1 | * | 7/2002 | Kang | ..................... G11C 29/34 365/145 |
| 2005/0270890 A1 | * | 12/2005 | Kim | ...................... G11C 7/1072 365/189.08 |
| 2008/0123453 A1 | * | 5/2008 | Seo | .......................... G11C 7/22 365/205 |
| 2008/0253203 A1 | * | 10/2008 | Bae | ........................... 365/189.15 |
| 2010/0109735 A1 | * | 5/2010 | Lee | ............................ G11C 7/08 327/288 |
| 2011/0044076 A1 | * | 2/2011 | Zhang et al. | ............... 363/21.17 |
| 2011/0181253 A1 | * | 7/2011 | Isham et al. | .................. 323/234 |

FOREIGN PATENT DOCUMENTS

KR 1020050093226 A 9/2005
KR 10-0868016 B1 12/2008

* cited by examiner

*Primary Examiner* — Huy Q Phan
*Assistant Examiner* — Dustin Dickinson
(74) *Attorney, Agent, or Firm* — William Park & Associates Ltd.

(57) ABSTRACT

A voltage monitoring test circuit includes a switching control signal generation unit configured to receive first and second switching signals, control the first and second switching signals such that an enable period of the first switching signal and an enable period of the second switching signal do not overlap with each other, and generate first and second switching control signals where a first voltage is transmitted in response to the first switching control signal and a second voltage is transmitted in response to the second switching control signal.

15 Claims, 7 Drawing Sheets

VOLTAGE MONITORING TEST CIRCUIT AND VOLTAGE MONITORING METHOD USING THE SAME

CROSS-REFERENCES TO RELATED APPLICATIONS

The present application claims priority under 35 U.S.C 119(a) to Korean Application No. 10-2011-0084889, filed on Aug. 25, 2011, in the Korean Intellectual Property Office, which is incorporated herein by reference in its entirety set forth in full.

BACKGROUND

In general, a memory device is supplied with an external voltage (VDD) and a ground voltage (VSS) and generates and uses internal voltages necessary for internal operations. The internal voltages necessary for the internal operations of a memory device include a core voltage (Vcore) to be supplied to a memory core region, a high voltage (Vpp) to be used upon driving of a word line or overdriving, and a low voltage (Vbb) to be supplied as a bulk voltage of an NMOS transistor of a core region. A voltage monitoring test circuit is used to monitor these various internal voltages.

Figure 1:
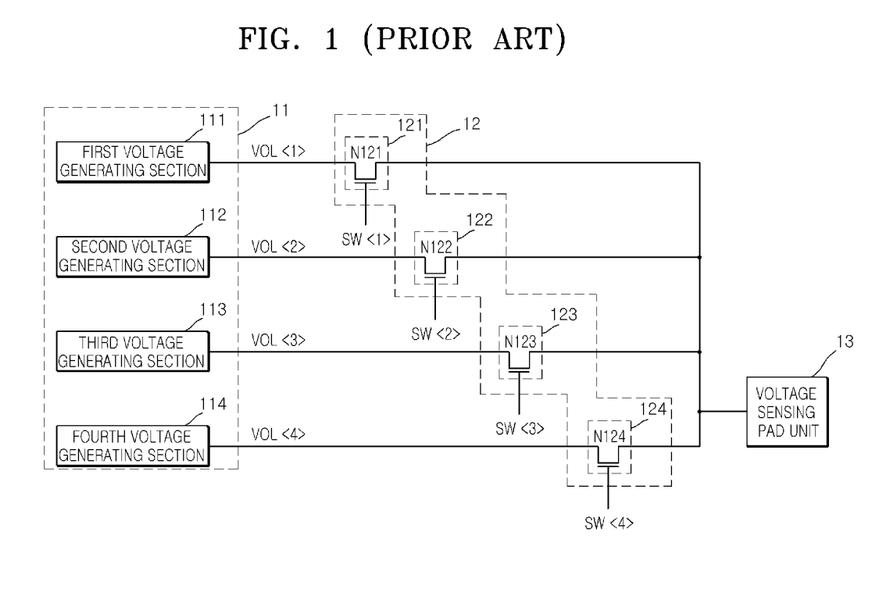
FIG. 1 is a block diagram illustrating the configuration of a prior art voltage monitoring test circuit.

FIG. 1 is a block diagram illustrating the configuration of a conventional voltage monitoring test circuit.

The conventional voltage monitoring test circuit includes a voltage generation unit 11, a transmission unit 12 and a voltage sensing pad unit 13.

The voltage generation unit 11 includes first to fourth voltage generating sections 111 to 114 and generates first to fourth voltages VOL<1:4>. The transmission unit 12 includes first to fourth transmitting sections 121 to 124 and transmits the first to fourth voltages VOL<1:4> to the voltage sensing pad unit 13 in response to first to fourth switching signals SW<1:4>. The voltage sensing pad unit 13 receives the first to fourth voltages VOL<1:4> and outputs the first to fourth voltages VOL<1:4>.

Figure 2:
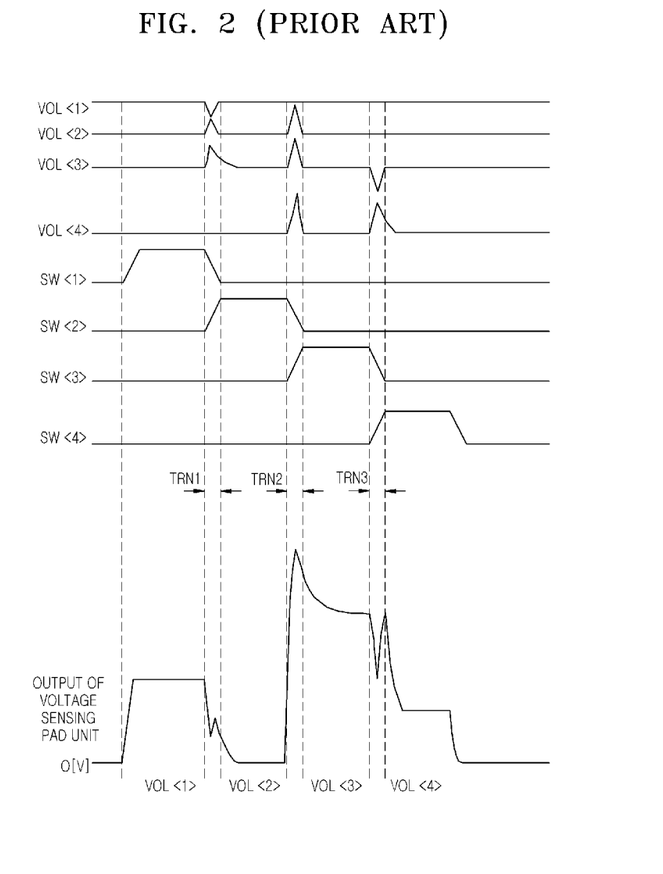
FIG. 2 is a timing diagram explaining operations of the prior art voltage monitoring test circuit.

Referring to FIG. 2, the first to fourth switching signals SW<1:4> are sequentially enabled to logic high levels. The first to fourth transmitting sections 121 to 124 sequentially transmit the first to fourth voltages VOL<1:4> to the voltage sensing pad unit 13 in response to such first to fourth switching signals SW<1:4>.

Since there is a period (hereinafter, referred to as a 'transition period') in which enable periods of the first to fourth switching signals SW<1:4> overlap with each other, short circuits occur in the first to fourth voltage generating sections 111 to 114. For example, in a transition period TRN1 in which the enable periods of the first switching signal SW<1> and the second switching signal SW<2> overlap with each other, a short circuit occurs between the first voltage generating section 111 and the second voltage generating section 112.

Further, when the voltage monitoring test circuit monitors a voltage, because charges remain in the voltage sensing pad unit 13, the first to fourth voltages VOL<1:4> cannot be precisely monitored. For example, when the voltage monitoring test circuit monitors the second voltage VOL<2> in response to the second switching signal SW<2>, because charges generated by a previously monitored first voltage VOL<1> may remain in the voltage sensing pad unit 13 for a certain period, monitoring of the second voltage VOL<2> may be affected by the first voltage VOL<1> that remains in the voltage sensing pad unit 13. Consequently, the second voltage VOL<2> cannot be precisely monitored.

Therefore, in the conventional voltage monitoring test circuit, since transition periods exist, short circuits occur between the first to fourth voltage generating sections 111 to 114, and since charges remain in the voltage sensing pad unit 13, the first to fourth voltages VOL<1:4> cannot be precisely monitored.

SUMMARY

Embodiments of the present invention relate to a voltage monitoring test circuit which can control switching signals for enable periods of the switching signals not to overlap with each other so as to prevent the occurrence of a transition period and can remove charges remaining in a voltage sensing pad unit each time when monitoring an internal voltage so as to precisely monitor a voltage, and a voltage monitoring method using the same.

In one embodiment, a voltage monitoring test circuit includes: a switching control signal generation unit configured to receive first and second switching signals, control the first and second switching signals such that an enable period of the first switching signal and an enable period of the second switching signal do not overlap with each other, and generate first and second switching control signals where a first voltage is transmitted in response to the first switching control signal, and a second voltage is transmitted in response to the second switching control signal.

In another embodiment a voltage monitoring test circuit comprises a transmission unit configured to receive first and second switching signals, transmit a first voltage to a voltage sensing pad unit in response to the first switching signal and transmit a second voltage to the voltage sensing pad unit in response to the second switching signal; a sink pulse generation unit configured to generate a sink pulse at a time when any one of the first and second switching signals is enabled; and a sink unit configured to connect the voltage sensing pad unit with a ground unit in response to the sink pulse.

In yet another embodiment, a voltage monitoring method includes: receiving first and second switching signals, controlling the first and second switching signals such that an enable period of the first switching signal and an enable period of the second switching signal do not overlap with each other, and generating first and second switching control signals; and transmitting a first voltage in response to the first switching control signal; and transmitting a second voltage in response to the second switching control signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 3:
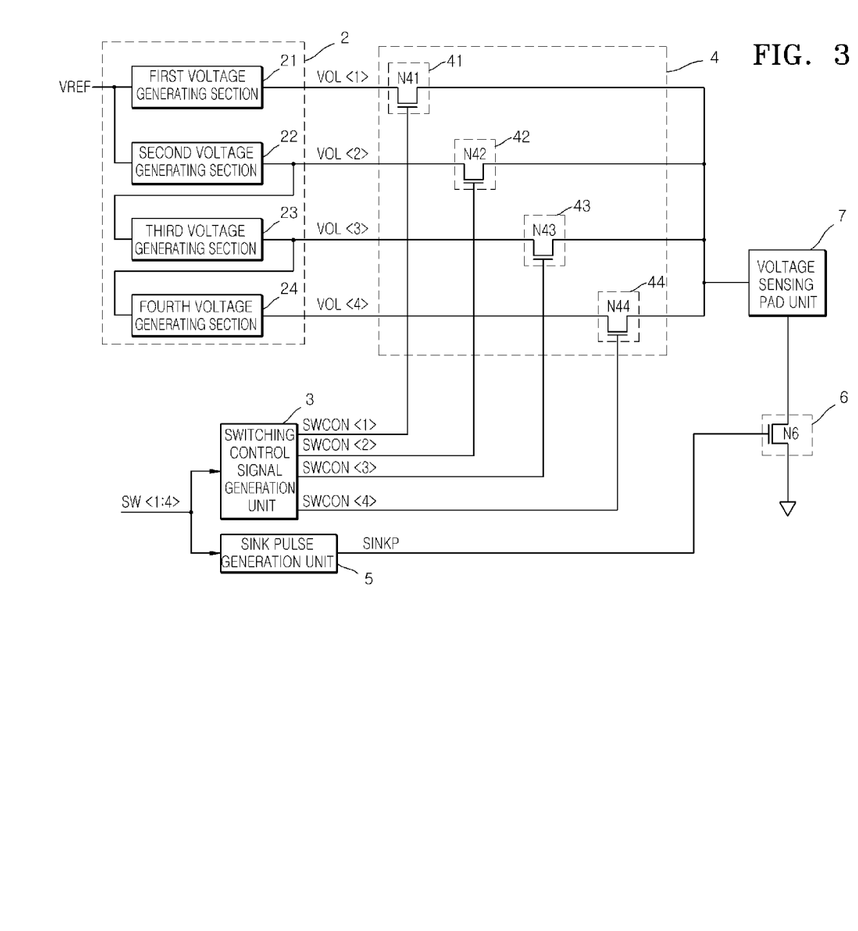
FIG. 3 is a block diagram illustrating a configuration of a voltage monitoring test circuit in accordance with an embodiment of the present invention.

FIG. 3 is a block diagram illustrating the configuration of a voltage monitoring test circuit in accordance with an embodiment of the present invention.

Referring to FIG. 3, the voltage monitoring test circuit in accordance with an embodiment of the invention includes a voltage generation unit 2, a switching control signal generation unit 3, a transmission unit 4, a sink pulse generation unit 5, a sink unit 6, and a voltage sensing pad unit 7. The voltage generation unit 2 is configured to generate first to fourth voltages VOL<1:4>. The switching control signal generation unit 3 is configured to delay enable timings of first to fourth switching signals SW<1:4> and generate first to fourth switching control signals SWCON<1:4>. The transmission unit 4 is configured to transmit the first to fourth voltages VOL<1:4> to the voltage sensing pad unit 7 in response to the first to fourth switching control signals SWCON<1:4>. The sink pulse generation unit 5 is configured to generate a sink pulse SINKP at a time when any one of the first to fourth switching signals SW<1:4> is enabled. The sink unit 6 is configured to connect the voltage sensing pad unit 7 with a ground unit in response to the sink pulse SINKP. Connecting the voltage sensing pad unit 7 with the ground unit may remove charges remaining in the voltage sensing pad unit 7 before the voltage sensing pad unit 7 monitors the respective first to fourth voltages VOL<1:4>. The voltage sensing pad unit 7 is configured to receive the first to fourth voltages VOL<1:4> and output the first to fourth voltages VOL<1:4> to an outside.

The voltage generation unit 2 includes a first voltage generating section 21, a second voltage generating section 22, a third voltage generating section 23, and a fourth voltage generating section 24. In the voltage generation unit 2 configured in this way, the first voltage generating section 21 and the second voltage generating section 22 respectively generate the first voltage VOL<1> and the second voltage VOL<2> based on a reference voltage VREF, and the third voltage generating section 23 generates the third voltage VOL<3> based on the second voltage VOL<2>, and the fourth voltage generating section 24 generates the fourth voltage VOL<4> based on the third voltage VOL<3>.

The voltage generation unit 2 with such a configuration generates the first to fourth voltages VOL<1:4>.

Figure 4:
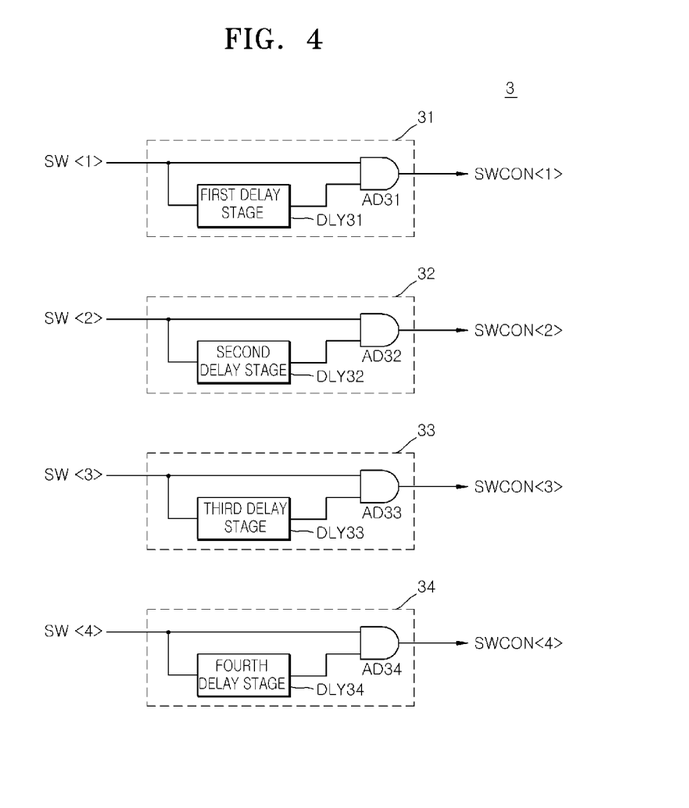
FIG. 4 is a circuit diagram of a switching control signal generation unit included in the voltage monitoring test circuit shown in FIG. 3.

Referring to FIG. 4, the switching control signal generation unit 3 includes a first switching control signal generating section 31, a second switching control signal generating section 32, a third switching control signal generating section 33, and a fourth switching control signal generating section 34.

The first switching control signal generating section 31 includes a first delay stage DLY31 which delays the first switching signal SW<1> and an AND gate AD31 which ANDs the first switching signal SW<1> and the output of the first delay stage DLY31. The first switching control signal generating section 31 configured in this way delays the enable timing of the first switching signal SW<1> by the delay period of the first delay stage DLY31 and generates the first switching control signal SWCON<1>. The second to fourth switching control signal generating sections 32 to 34 are configured in the same way as the first switching control signal generating section 31 except that they respectively delay the enable timings of the second to fourth switching signals SW<2:4> by the delay periods of second to fourth delay stages DLY32 to DLY34 and generates the second to fourth switching control signals SWCON<2:4>. Therefore, further detailed descriptions of the second to fourth switching control signal generating sections 32 to 34 will be omitted herein.

The switching control signal generation unit 3 with such a configuration delays the respective enable timings of the first to fourth switching signals SW<1:4> and generates the first to fourth switching control signals SWCON<1:4>.

Referring to FIG. 3, the transmission unit 4 includes a first transmitting section 41, a second transmitting section 42, a third transmitting section 43, and a fourth transmitting section 44. The first transmitting section 41 includes an NMOS transistor N41 and transmits the first voltage VOL<1> to the voltage sensing pad unit 7 when the first switching control signal SWCON<1> is a logic high level, the second transmitting section 42 includes an NMOS transistor N42 and transmits the second voltage VOL<2> to the voltage sensing pad unit 7 when the second switching control signal SWCON<2> is a logic high level, the third transmitting section 43 includes an NMOS transistor N43 and transmits the third voltage VOL<3> to the voltage sensing pad unit 7 when the third switching control signal SWCON<3> is a logic high level, and the fourth transmitting section 44 includes an NMOS transistor N44 and transmits the fourth voltage VOL<4> to the voltage sensing pad unit 7 when the fourth switching control signal SWCON<4> is a logic high level.

The transmission unit 4 with such a configuration transmits the first to fourth voltages VOL<1:4> to the voltage sensing pad unit 7 in response to the first to fourth switching control signals SWCON<1:4>.

Figure 5:
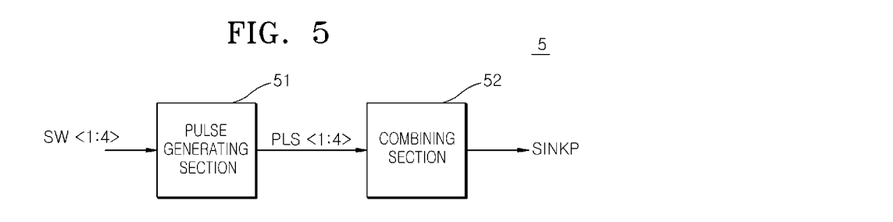
FIG. 5 is a block diagram illustrating a configuration of a sink pulse generation unit included in the voltage monitoring test circuit shown in FIG. 3.

Referring to FIG. 5, the sink pulse generation unit 5 includes a pulse generating section 51 and a combining section 52.

Figure 6:
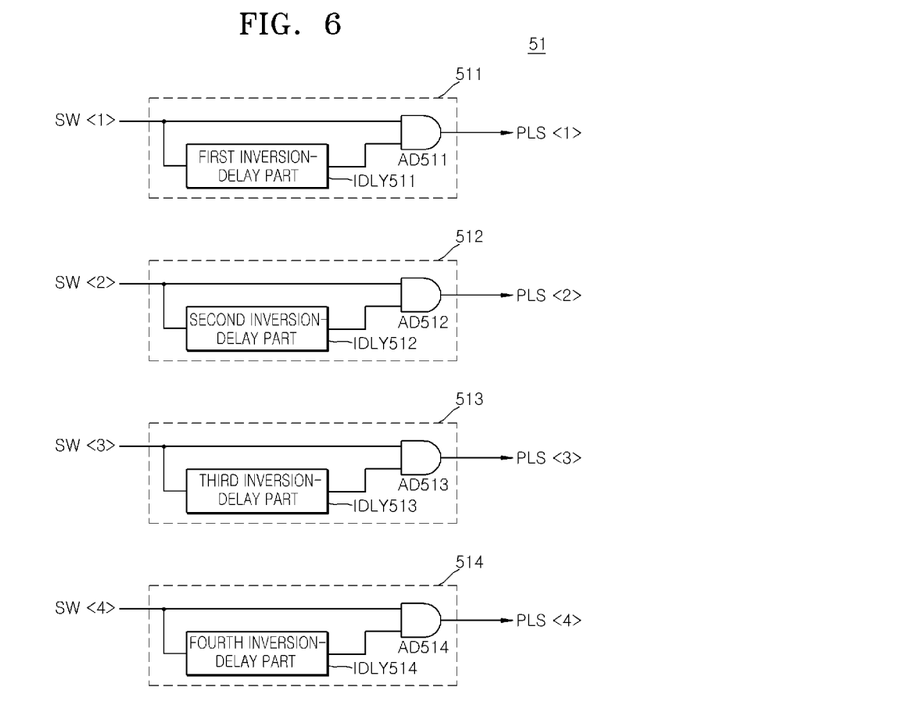
FIG. 6 is a circuit diagram of a pulse generating section included in the sink pulse generation unit shown in FIG. 5.

Referring to FIG. 6, the pulse generating section 51 includes a first pulse generation stage 511, a second pulse generation stage 512, a third pulse generation stage 513 and a fourth pulse generation stage 514, and generates first to fourth pulses PLS<1:4> when the first to fourth switching signals SW<1:4> are enabled.

The first pulse generation stage 511 includes a first inversion-delay part IDLY511 which inversion-delays the first switching signal SW<1> and an AND gate AD511 which ANDs the first switching signal SW<1> and the output of the first inversion-delay part DLY511. The first pulse generation stage 511 configured in this way generates the first pulse PLS<1> when the first switching signal SW<1> is enabled. Since the second to fourth pulse generation stages 512 to 514 are configured in the same way as the first pulse generation stage 511 except that they generate the second to fourth pulses PLS<2:4> when the second to fourth switching signals SW<2:4> are enabled, further detailed descriptions thereof will be omitted herein.

Figure 7:
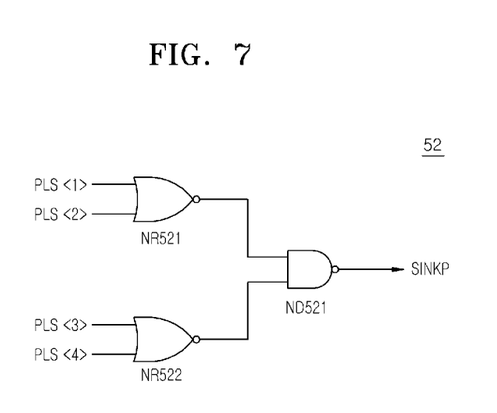
FIG. 7 is a circuit diagram of a combining section included in the sink pulse generation unit shown in FIG. 5.

Referring to FIG. 7, the combining section 52 includes a NOR gate NR521 which receives and NORs the first pulse PLS<1> and the second pulse PLS<2>, a NOR gate NR522 which receives and NORs the third pulse PLS<3> and the fourth pulse PLS<4>, and a NAND gate ND521 which receives and NANDs the outputs of the NOR gates NR521 and NR522. The combining section 52 configured in this way generates the sink pulse SINKP when any one of the first to fourth pulses PLS<1:4> is generated.

The sink pulse generation unit 5 with such a configuration generates the sink pulse SINKP when any one of the first to fourth switching signals SW<1:4> is enabled.

The sink unit 6 includes an NMOS transistor N6 and is connected between the voltage sensing pad unit 7 and a ground unit. The sink unit 6 with such a configuration connects the voltage sensing pad unit 7 with the ground unit when the sink pulse SINKP is a logic high level and removes charges remaining in the voltage sensing pad unit 7 before monitoring the respective first to fourth voltages VOL<1:4>.

The voltage sensing pad unit 7 receives the first to fourth voltages VOL<1:4> and outputs the first to fourth voltages VOL<1:4>.

Hereafter, operations of the voltage monitoring test circuit configured as mentioned above will be described with reference to FIGS. 3 to 8 where, for purposes of illustration, the first voltage VOL<1> is set to 2.1V, the second voltage VOL<2> is set to 0.6V, the third voltage VOL<3> is set to 3.3V and the fourth voltage VOL<4> is set to 1.5V.

First, the voltage generation unit 2 generates the first to fourth voltages VOL<1:4>. In detail, referring to FIGS. 3 and 8, the first voltage generating section 21 generates the first voltage VOL<1> of 2.1V based on the reference voltage VREF, the second voltage generating section 22 generates the second voltage VOL<2> of 0.6V based on the reference voltage VREF, the third voltage generating section 23 generates the third voltage VOL<3> of 3.3V based on the second voltage VOL<2> of 0.6V, and the fourth voltage generating section 24 generates the fourth voltage VOL<4> of 1.5V based on the third voltage VOL<3> of 3.3V.

Figure 8:
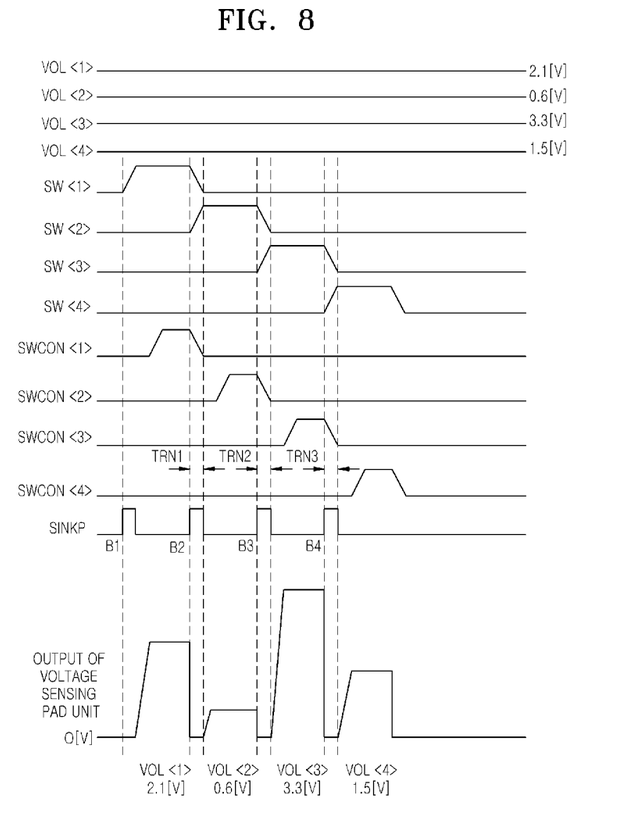
FIG. 8 is a timing diagram explaining operations of the voltage monitoring test circuit in accordance with an embodiment of the present invention.

The switching control signal generation unit 3 delays the respective enable timings of the first to fourth switching signals SW<1:4> and generates the first to fourth switching control signals SWCON<1:4>.

The transmission unit 4 transmits the first to fourth voltages VOL<1:4> to the voltage sensing pad unit 7 in response to the first to fourth switching control signals SWCON<1:4>. In detail, referring to FIG. 3, the first transmitting section 41 transmits the first voltage VOL<1> of 2.1V to the voltage sensing pad unit 7 in response to the first switching control signal SWCON<1>, the second transmitting section 42 transmits the second voltage VOL<2> of 0.6V to the voltage sensing pad unit 7 in response to the second switching control signal SWCON<2>, the third transmitting section 43 transmits the third voltage VOL<3> of 3.3V to the voltage sensing pad unit 7 in response to the third switching control signal SWCON<3>, and the fourth transmitting section 44 transmits the fourth voltage VOL<4> of 1.5V to the voltage sensing pad unit 7 in response to the fourth switching control signal SWCON<4>.

Next, the sink pulse generation unit 5 generates the sink pulse SINKP when any one of the first to fourth switching signals SW<1:4> is enabled. In detail, referring to FIGS. 6 and 8, the pulse generating section 51 generates the first to fourth pulses PLS<1:4> at times B1 to B4 when the first to fourth switching signals SW<1:4> are respectively enabled, and the combining section 52 generates the sink pulse SINKP at the time when any one of the first to fourth pulses PLS<1:4> is generated.

The sink unit 6 connects the voltage sensing pad unit 7 with the ground unit when the sink pulse SINKP is the logic high level and removes the charges remaining in the voltage sensing pad unit 7 before monitoring the respective first to fourth voltages VOL<1:4>. Accordingly, the voltage sensing pad unit 7 can receive and precisely output the first voltage VOL<1> of 2.1V, the second voltage VOL<2> of 0.6V, the third voltage VOL<3> of 3.3V and the fourth voltage VOL<4> of 1.5V.

As is apparent from the above descriptions, in the voltage monitoring test circuit in accordance with an embodiment of the present invention, the first to fourth switching signals SW<1:4> are controlled for the enable periods thereof not to overlap with each other so that a transition period does not occur, and the charges remaining in the voltage sensing pad unit 7 are removed each time when monitoring an internal voltage so that a voltage can be precisely monitored. The voltage monitoring test circuit in accordance with an embodiment of the present invention may be applied not only to semiconductor memory devices but also to various electronic circuits.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:
1. A voltage monitoring test circuit comprising:
    a switching control signal generation unit configured to receive first and second switching signals, and generate first and second switching control signals control the first and second switching, control signals such that an enable period of the first switching control signal and an enable period of the second switching control signal do not overlap with each other, where a first voltage is transmitted in response to the first switching control signal, and a second voltage is transmitted in response to the second switching control signal; and
    a sink pulse generation unit configured to receive the first and second switching signals and generate a sink pulse at a time when any one of the first and second switching signals is enabled, and
    wherein the first voltage and the second voltage having each other different constant voltage level,
    wherein the second switching control signal is enabled after a predetermined delay time elapses from a point of time that the first switching control signal is disabled.
2. The voltage monitoring test circuit according to claim 1, wherein the switching control signal generation unit comprises:
    a first switching control signal generating section configured to delay an enable timing of the first switching signal by a first period and generate the first switching control signal; and
    a second switching control signal generating section configured to delay an enable timing of the second switching signal by a second period and generate the second switching control signal.
3. The voltage monitoring test circuit according to claim 1, further comprising:
    a sink unit configured to connect a voltage sensing pad unit with a ground unit in response to the sink pulse, where the voltage sensing pad unit receives the first and second voltage transmitted via a transmission unit configured to respectively transmit the first and second voltage in response to the first and second switching control signal.

4. The voltage monitoring test circuit according to claim 3, further comprising:
a voltage generation unit configured to generate the first and second voltages based on a reference voltage.

5. The voltage monitoring test circuit according to claim 3, further comprising:
a voltage generation unit configured to generate the first voltage based on a reference voltage and generate the second voltage based on the first voltage.

6. The voltage monitoring test circuit according to claim 1, wherein the sink pulse generation unit comprises:
a pulse generating section configured to generate a first pulse at a time when the first switching signal is enabled and generate a second pulse at a time when the second switching signal is enabled; and
a combining section configured to generate the sink pulse at a time when the first or second pulse is generated.

7. The voltage monitoring test circuit according to claim 6, wherein the pulse generating section comprises:
a first pulse generation stage configured to generate the first pulse at the time when the first switching signal is enabled; and
a second pulse generation stage configured to generate the second pulse at the time when the second switching signal is enabled.

8. A voltage monitoring test circuit comprising:
a transmission unit configured to receive first and second switching signals, transmit a first voltage to a voltage sensing pad unit in response to the first switching signal and transmit a second voltage to the voltage sensing pad unit in response to the second switching signal;
a sink pulse generation unit configured to generate a sink pulse at a time when any one of the first and second switching signals is enabled; and
a sink unit configured to connect the voltage sensing pad unit with a ground unit in response to the sink pulse;
wherein the first voltage and the second voltage having each other different constant voltage level,
wherein the second switching control signal is enabled after a predetermined delay time elapses from a point of time that the first switching control signal is disabled.

9. The voltage monitoring test circuit according to claim 8, wherein the sink pulse generation unit comprises:
a pulse generating section configured to generate a first pulse at a time when the first switching signal is enabled and generate a second pulse at a time when the second switching signal is enabled; and
a combining section configured to generate the sink pulse at a time when the first or second pulse is generated.

10. The voltage monitoring test circuit according to claim 9, wherein the pulse generating section comprises:
a first pulse generation stage configured to generate the first pulse at the time when the first switching signal is enabled; and
a second pulse generation stage configured to generate the second pulse at the time when the second switching signal is enabled.

11. The voltage monitoring test circuit according to claim 8, further comprising:
a voltage generation unit configured to generate the first and second voltages based on a reference voltage.

12. The voltage monitoring test circuit according to claim 8, further comprising:
a voltage generation unit configured to generate the first voltage based on a reference voltage and generate the second voltage based on the first voltage.

13. A voltage monitoring method comprising:
receiving first and second switching signals, controlling the first and second switching signals such that an enable period of the first switching signal and an enable period of the second switching signal do not overlap with each other, and generating first and second switching control signals, and the generating of the first and second switching control signals, an enable timing of the first switching signal is delayed by a first period and the first switching control signal is generated, and an enable timing of the second switching signal is delayed by a second period and the second switching control signal is generated; and
transmitting a first voltage in response to the first switching control signal;
transmitting a second voltage in response to the second switching control signal; and
generating a sink pulse at a time when any one of the first and second switching signals is enabled; and
wherein the first voltage and the second voltage having each other different constant voltage level,
wherein the second switching control signal is enabled after a predetermined delay time elapses from a point of time that the first switching control signal is disabled.

14. The voltage monitoring method according to claim 13, wherein the first voltage is transmitted to a voltage sensing pad unit in response to the first switching control signal, where transmitting the first voltage in response to the first switching control signal comprises:
connecting the voltage sensing pad unit with a ground unit in response to the sink pulse.

15. The voltage monitoring method according to claim 14, wherein the generating of the sink pulse at a time when any one of the first and second switching signals is enabled comprises:
generating a first pulse at a time when the first switching signal is enabled and generating a second pulse at a time when the second switching signal is enabled; and
generating the sink pulse at a time when the first or second pulse is generated.

* * * * *